(12) United States Patent
Painting et al.

(10) Patent No.: US 11,313,919 B2
(45) Date of Patent: Apr. 26, 2022

(54) SOCKET TESTER WITH SWITCHABLE AUDIBLE INDICATOR OF DETECTED PRESENCE OF VOLTAGE

(71) Applicant: Fluke Corporation, Everett, WA (US)

(72) Inventors: Brian D. Painting, Seattle, WA (US); Luis R. Silva, Lynwood, WA (US)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 17/026,099

(22) Filed: Sep. 18, 2020

(65) Prior Publication Data

US 2022/0091194 A1    Mar. 24, 2022

(51) Int. Cl.
*G01R 31/69* (2020.01)
*H01R 13/66* (2006.01)

(52) U.S. Cl.
CPC ......... *G01R 31/69* (2020.01); *H01R 13/6683* (2013.01); *H01R 2201/02* (2013.01)

(58) Field of Classification Search
None
See application file for complete search history.

(56) References Cited

U.S. PATENT DOCUMENTS

| | | | |
|---|---|---|---|
| 4,725,772 A * | 2/1988 | Peak | G01R 31/58 324/66 |
| 9,116,178 B1 * | 8/2015 | Czarnecki | G01R 31/50 |
| 10,746,811 B2 | 8/2020 | Chun | |
| 2009/0212964 A1 * | 8/2009 | Hibma | G01R 31/66 340/657 |

OTHER PUBLICATIONS

Northern Tool + Equipment, "Reliance CircuitScout Circuit Breaker Locator, Model# THP109," product data sheet and online marketplace, downloaded from https://www.northerntool.com/shop/tools/product_200702783_2007027 on Aug. 3, 2020, 2 pages.

* cited by examiner

*Primary Examiner* — Jas A Sanghera
(74) *Attorney, Agent, or Firm* — Seed Intellectual Property Law Group LLP (57) ABSTRACT

A socket tester device includes an electrical plug that is to be inserted into an electrical socket, a tester circuit electrically coupled to the electrical plug, a sound emitting device, a communication device, a processor, and a memory. The tester circuit outputs one or more signals indicating a wiring condition of the electrical socket into which the electrical plug is inserted. The memory stores instructions that, when executed by the processor, cause the processor to receive the one or more signals indicating the wiring condition of the electrical socket into which the electrical plug is inserted, control the communication device to wirelessly transmit a first message that includes data indicating the wiring condition of the electrical socket into which the electrical plug is inserted, and control whether the sound emitting device emits one or more sounds.

18 Claims, 3 Drawing Sheets

(Prior Art)

SOCKET TESTER WITH SWITCHABLE AUDIBLE INDICATOR OF DETECTED PRESENCE OF VOLTAGE

BACKGROUND

Technical Field

The present disclosure relates to electrical socket testing and more particularly to socket tester devices that provide output indicating results of socket testing to users.

Description of the Related Art

A socket tester, also known as an outlet tester or receptacle tester, may have a primary function of visually indicating to a user whether or not an outlet is properly wired. When a user inserts the plug of a socket tester into an outlet, the user can identify if the outlet is correctly or incorrectly wired via a set of light emitting diodes (LEDs) on the tester. If the outlet is incorrectly wired, the user can identify how the outlet is incorrectly wired via the same set of LEDs. Finally, if there is no voltage present at the outlet being tested, the LEDs will not light up thereby indicating to the user that no voltage is present.

An often-used secondary function of a socket tester is to discern which circuit breaker is connected to a particular outlet or vice-versa. Currently there are two common solutions to do this. One common solution is to buy an additional tool called a circuit breaker finder tracer. This is a two-piece tool that involves inserting a first part into the outlet to be tested and taking a second part to a circuit breaker panel. The user then scans the circuit breaker panel with the second part to identify the particular circuit breaker to which the first part of the tool is connected.

Another way to discern which circuit breaker is connected to a particular outlet, or vice-versa, involves the user inserting the socket tester into an outlet and visually seeing via the LEDs if voltage is present. Then the user has to walk to the circuit breaker panel, often in a different room, switch a circuit breaker, and walk back to the tester to see if voltage in the outlet is no longer present. The user repeats this until the corresponding circuit breaker is found, which is very time consuming and cumbersome.

BRIEF SUMMARY

Accordingly, it is desirable to provide a socket tester device that can audibly indicate to a user whether a particular circuit breaker is connected to socket into which the socket tester device is inserted. In addition, it is desirable to provide a socket tester device that can wirelessly transmit a messaging that indicates to a user whether a particular circuit breaker is connected to the socket into which the socket tester device is inserted.

A socket tester device according to the present disclosure may be summarized as including: an electrical plug configured to be inserted into an electrical socket; a tester circuit electrically coupled to the electrical plug; a sound emitting device; a communication device; a processor electrically coupled to the tester circuit, the sound emitting device, and the communication device; and a memory storing instructions. The tester circuit outputs one or more signals indicating a wiring condition of the electrical socket into which the electrical plug is inserted. The instructions, when executed by the processor, cause the processor to: receive the one or more signals indicating the wiring condition of the electrical socket into which the electrical plug is inserted, control the communication device to wirelessly transmit a first message that includes data indicating the wiring condition of the electrical socket into which the electrical plug is inserted, and control whether the sound emitting device emits one or more sounds.

The communication device, in operation, may wirelessly receive a second message, and the instructions, when executed by the processor, may cause the processor to control whether the sound emitting device emits the one or more sounds in response to data in the second message received by the communication device. The instructions, when executed by the processor, may cause the processor to control whether the sound emitting device emits one or more sounds based on a value included in a field of the second message. The instructions, when executed by the processor, may cause the processor to output a first control signal that causes the sound emitting device to emit the one or more sounds with a first acoustic characteristic in response to the field included in the second message having a first value, and to output a second control signal that causes the sound emitting device to emit the one or more sounds with a second acoustic characteristic that is different from the first acoustic characteristic in response to the field included in the second message having a second value. The one or more sounds with the first acoustic characteristic may have a greater volume level than the one or more sounds with second acoustic characteristic. The one or more sounds with the first acoustic characteristic may have a different duration than the one or more sounds with the second acoustic characteristic. The instructions, when executed by the processor, may cause the processor to output a control signal that causes the sound emitting device to emit the one or more sounds, in response to receiving the second message.

The instructions, when executed by the processor, may cause the processor to transmit the first message in response to determining that the electrical plug is no longer receiving power from the electrical socket.

The instructions, when executed by the processor, may cause the processor to cause the sound emitting device to emit the one or more sounds in response to determining that the electrical plug is no longer receiving power from the electrical socket.

The instructions, when executed by the processor, may cause the processor to transmit the first message or cause the sound emitting device to emit the one or more sounds in response to determining that the electrical plug has started receiving power from the electrical socket.

The socket tester device may further include a switch circuit electrically coupled to the processor and the sound emitting device, and the instructions, when executed by the processor, may cause the processor to control whether the switch circuit is in an electrically conductive state or an electrically non-conductive state, to control whether sound emitting device emits the one or more sounds. The switch circuit may be electrically coupled between the electrical plug and the sound emitting device.

The socket tester device may further include a plurality of light emitting devices, and one or more of the light emitting devices may be illuminated based on the wiring condition of the electrical socket into which the electrical plug is inserted.

The electrical socket may include a first receptacle configured to be electrically coupled to a neutral voltage potential, a second receptacle configured to be electrically coupled to a hot voltage potential, and a third receptacle configured to be electrically coupled to a ground voltage potential. The wiring condition of the electrical socket may be selected from a group consisting of: a first wiring condition in which the first receptacle is electrically coupled to the neutral voltage potential, the second receptacle is electrically coupled to the hot voltage potential, and the third receptacle is electrically coupled to the ground voltage potential; a second wiring condition in which the third receptacle is not electrically coupled to the ground voltage potential; a third wiring condition in which the first receptacle is not electrically coupled to the neutral voltage potential; a fourth wiring condition in which the second receptacle is not electrically coupled to the hot voltage potential; a fifth wiring condition in which the first receptacle is electrically coupled to the hot voltage potential and the second receptacle is electrically coupled to the neutral voltage potential; and a sixth wiring condition in which the second receptacle is electrically coupled to the ground voltage potential, and the third receptacle is electrically coupled to the hot voltage potential. The instructions, when executed by the processor, may cause the processor to output a first control signal that causes the sound emitting device to emit the one or more sounds with a first acoustic characteristic in response to the wiring condition of the electrical socket being the first wiring condition, the second wiring condition, the third wiring condition, or the fourth wiring condition. The instructions, when executed by the processor, may cause the processor to output a second control signal that causes the sound emitting device to emit the one or more sounds with a second acoustic characteristic that is different from the first acoustic characteristic in response to the wiring condition of the electrical socket being the fifth wiring condition or the sixth wiring condition.

A method of operating a socket tester device that includes an electrical plug configured to be inserted into an electrical socket, a communication device, a processor, and a sound emitting device according to the present disclosure may be summarized as including: receiving, by the processor, one or more signals indicating a wiring condition of the electrical socket into which the electrical plug is inserted; wirelessly transmitting, by the communication device, a first message that includes data indicating the wiring condition of the electrical socket into which the electrical plug is inserted; and outputting, by the processor, a control signal that controls whether the sound emitting device emits one or more sounds.

The method may further include: wirelessly receiving, by the communication device, a second message, and the outputting the control signal that controls whether the sound emitting device emits the one or more sounds may be performed in response to a value in the received second message.

The outputting the control signal that controls whether the sound emitting device emits the one or more sounds may be performed in response to the one or more signals indicating the wiring condition of the electrical socket into which the electrical plug is inserted.

The socket tester device may include a switch circuit electrically coupled to the processor and the sound emitting device, and the control signal that controls whether the sound emitting device emits the one or more sounds may control whether the switch circuit is in an electrically conductive state or an electrically non-conductive state.

The method may further include determining that the electrical plug is no longer receiving power from the electrical socket, and the outputting the control signal that controls whether the sound emitting device emits the one or more sounds may include outputting a control signal causes the sound emitting device to emit the one or more sounds in response to the determining that the electrical plug is no longer receiving power from the electrical socket.

The method may further include: determining that the electrical plug is no longer receiving power from the electrical socket, and the transmitting the first message that includes data indicating the wiring condition of the electrical socket into which the electrical plug is inserted may be performed in response to the determining that the electrical plug is no longer receiving power from the electrical socket.

DETAILED DESCRIPTION

As shown in FIGS. 1A to 1D, the socket tester device 100 includes light emitting devices 102, 104, 106, and 108, which are illuminated to visually indicate results of testing performed by the socket tester device 100. In one or more embodiments, the light emitting devices 102, 104, 106, and 108 are LEDs. The socket tester device 100 also includes a button 110 and a switch 112, which can be operated by a user.

In addition, the socket tester device 100 includes an electrical plug 114 having terminals 116, 118, and 120. In one or more embodiments, the electrical plug 114 is a plug type B, or National Environment Management Authority (NEMA) 5-15, 3 pin plug. The terminals 116 and 118 are flat and arranged in parallel. The terminal 120 is round. Other embodiments may implement an electrical plug 114 having a different configuration, as appropriate for the location where the socket tester device 100 is to be used.

Figure 1A:
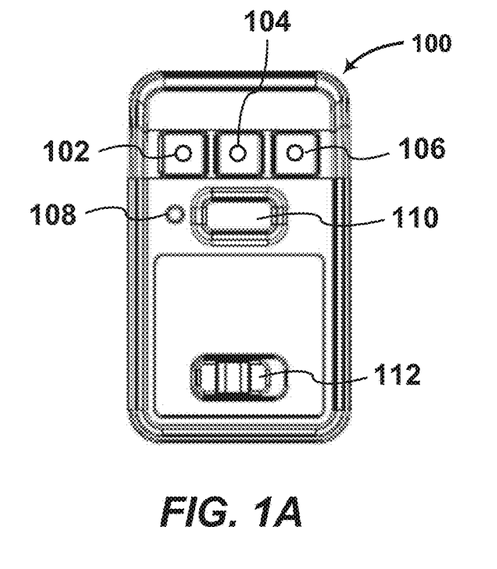
FIG. 1A is a front elevation of a socket tester device according to one or more embodiments of the present disclosure.
Figure 1B:
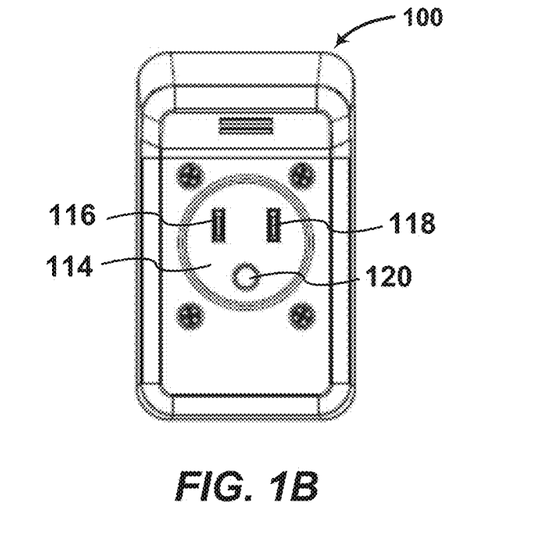
FIG. 1B is a rear elevation view of the socket tester device shown in FIG. 1A.
Figure 1C:
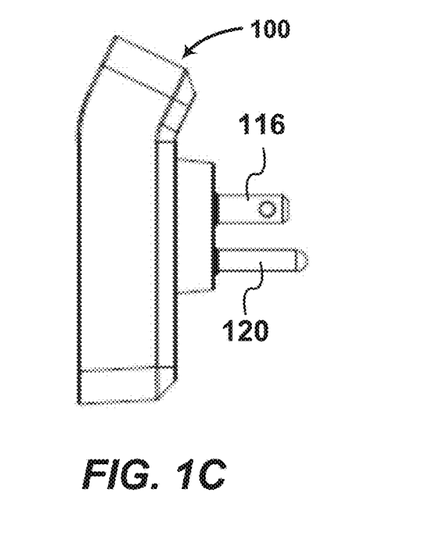
FIG. 1C is a right side elevation view of the socket tester device shown in FIG. 1A.
Figure 1D:
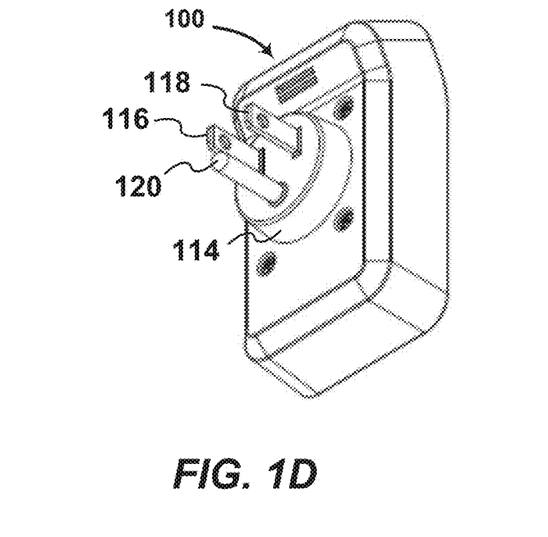
FIG. 1D is a bottom, rear, left side perspective view of the socket tester device shown in FIG. 1A.
Figure 2:
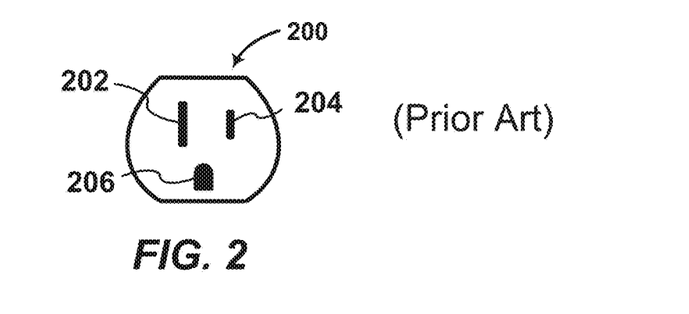
FIG. 2 is a front elevation view of a socket that can be tested using the socket tester device shown in FIG. 1A.

FIG. 2 is a front elevation of an electrical socket 200 that can be tested using the socket tester device shown in FIG. 1A. The socket includes receptacles 202, 204, and 206. The receptacle 202 is configured to be electrically coupled to a neutral voltage potential, the receptacle 204 is configured to be electrically coupled to a hot (non-zero) voltage potential, and the receptacle 206 is configured to be electrically coupled to a ground voltage potential. More particularly, the receptacle 202 includes an electrical conductor that, if properly wired, is electrically coupled to the neutral voltage potential. The receptacle 204 includes an electrical conductor that, if properly wired, is electrically coupled to the hot voltage potential. The receptacle 206 includes an electrical conductor that, if properly wired, is electrically coupled to the ground voltage potential.

The electrical plug 114 is configured to be inserted into the electrical socket 200. More particularly, when the electrical plug 114 of the socket tester device 100 is inserted into the electrical socket 200, the terminal 116 is inserted into the receptacle 204 and is electrically coupled to the electrical conductor therein. Also, the terminal 118 is inserted into the receptacle 202 and is electrically coupled to the electrical conductor therein. In addition, the terminal 120 is inserted into the receptacle 206 and is electrically coupled to the electrical conductor therein.

Figure 3:
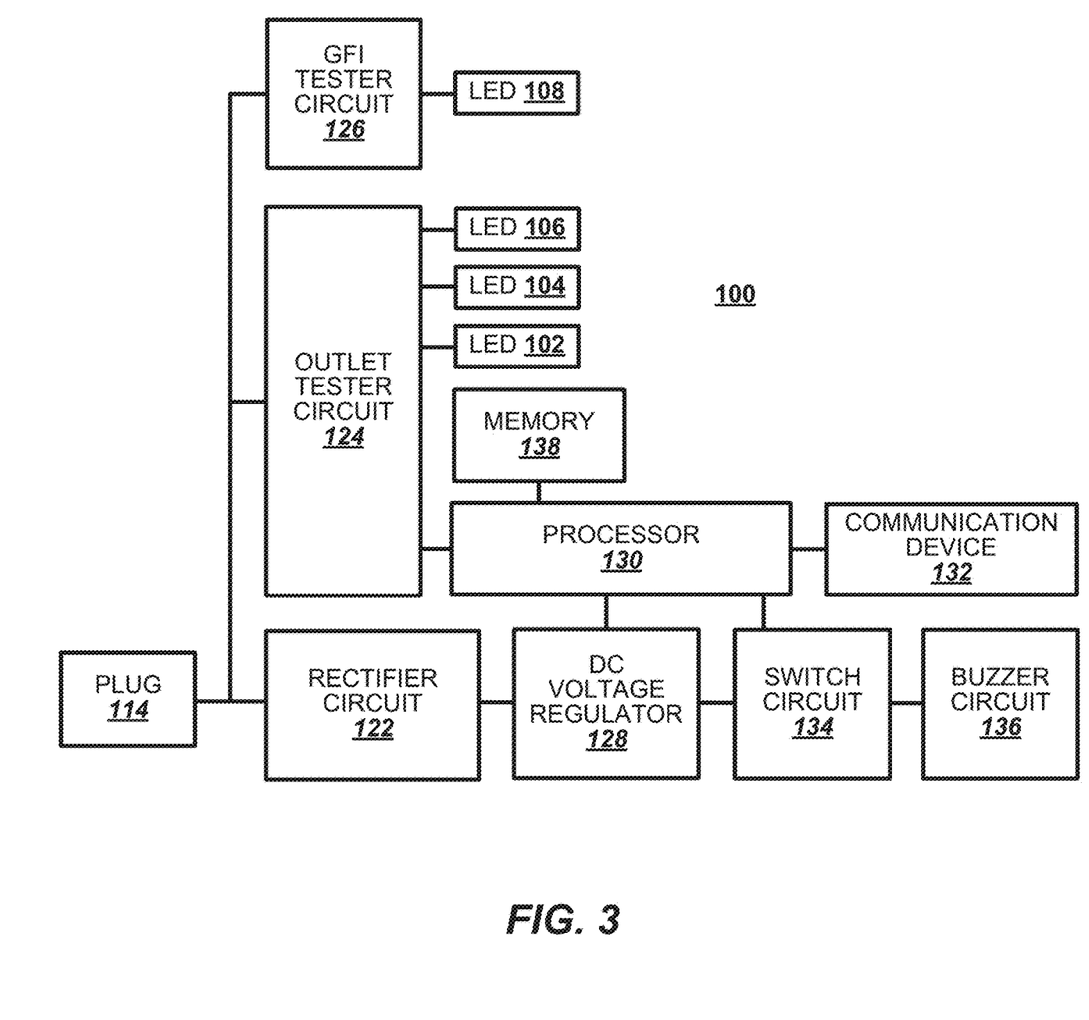
FIG. 3 is a block diagram of the socket tester device shown in FIG. 1A, according to one or more embodiments of the present disclosure.

FIG. 3 is a block diagram of the socket tester device 100, according to one or more embodiments of the present disclosure. The electrical plug 114 is electrically coupled to a rectifier circuit 122, an outlet tester circuit 124, and a ground fault interrupter (GFI) tester circuit 126.

The rectifier circuit 122 converts alternating current (AC) to direct current (DC). In one or more embodiments, the rectifier circuit 122 is a full-wave bridge rectifier that includes a plurality of diodes arranged in a diode bridge network. The rectifier circuit 122 outputs the direct current to a DC voltage regulator 128.

The DC voltage regulator 128 generates a fixed output voltage of a preset magnitude, which remains constant regardless of changes to its input voltage. In one or more embodiments, the DC voltage regulator 128 is a buck converter. The DC voltage regulator 128 outputs the fixed voltage to a processor 130, a communication device 132, and a switch circuit 134.

The switch circuit 134 is electrically coupled to a buzzer circuit 136. While power is provided to the electrical plug 114 and the switch circuit 134 is in a conductive state, the voltage output from the DC voltage regulator 128 is provided the buzzer circuit 136, which causes a sound emitting device (e.g., a buzzer) included in the buzzer circuit 136 to emit a relatively loud sound, for example, that can be heard in a different location (e.g., on a different floor or in another room or garage of a house). While the switch circuit 134 is in a non-conductive state, the DC voltage regulator 128 does not provide a voltage output to the buzzer circuit 136, and the buzzer does not emit sound.

In one or more embodiments, the switch circuit 134 is mechanically coupled to the switch 112. While the switch 112 is in a first position, the switch circuit 134 is in the conductive state. While the switch 112 is in a second position, the switch circuit 134 is in the non-conductive state.

In one or more embodiments, the switch circuit 134 is electrically coupled to the processor 130. While the processor 130 provides a control signal having a first voltage level to the switch circuit 134, the switch circuit 134 is in the conductive state. While the processor 130 provides a control signal having a second voltage level to the switch circuit 134, the switch circuit 134 is in the non-conductive state.

For example, the switch circuit 134 includes a metal-oxide-semiconductor field-effect transistor (MOSFET) having a gate terminal, a source terminal, and a drain terminal, wherein the gate terminal is electrically coupled to the processor, the source terminal is electrically coupled to the DC voltage regulator 128, and the drain terminal is electrically coupled to the buzzer circuit 136. The processor supplies control signals to the gate terminal to control whether the transistor is in an electrically conductive state or an electrically non-conductive state. In one or more embodiments, the processor supplies a control signal having a relatively high voltage level to the gate terminal to control the transistor to be in the electrically conductive state, and supplies a control signal having a relatively low voltage level to the gate terminal to control the transistor to be in the electrically non-conductive state. In one or more alternative embodiments, the processor supplies a control signal having a relatively low voltage level to the gate terminal to control the transistor to be in the electrically conductive state, and supplies a control signal having a relatively high voltage level to the gate terminal to control the transistor to be in the electrically non-conductive state. While the transistor is in the electrically conductive state, a current flows from the DC voltage regulator 128 to the buzzer circuit, which causes the sound emitting device of the buzzer circuit to emit sound. While the transistor is in the electrically non-conductive state, no current flows from the DC voltage regulator 128 to the buzzer circuit, and the sound emitting device of the buzzer circuit does not emit sound.

The outlet tester circuit 124 determines whether or not a socket (e.g., electrical socket 200) into which the electrical plug 114 is inserted is wired correctly. If the socket is not wired correctly, the outlet tester circuit 124 indicates to a user a problem that is preventing the socket from being properly operated, as will be explained below with reference to FIG. 3 and Table 1.

The light emitting devices 102, 104, 106 are illuminated based on a wiring condition of the electrical socket (e.g., electrical socket 200) into which the electrical plug 114 is inserted, based on control signals that are output from the outlet tester circuit 124. In one or more embodiments, the outlet tester circuit 124 outputs first, second, and third control signals to the light emitting devices 102, 104, 106, respectively. In one or more embodiments, the outlet tester circuit 124 also outputs the first, second, and third control signals to respective input terminals of the processor 130, to inform the processor 130 of a wiring conduction detected by the outlet tester circuit 124. Alternatively, instead of outputting to the processor 130 the first, second, and third control signals, the outlet tester circuit 124 may output to an input terminal of the processor 130 a fourth control signal that is based on the first, second, and third control signals. For example, the fourth control signal indicates a three-bit value, wherein each bit of the three-bit value is based on a value of one of the first, second, and third control signals. The processor 130 determines a result of testing by the outlet tester circuit 124 using a look-up table (or other suitable data structure) stored by a memory 138. For example, each entry of such a look-up table includes one of the values shown in Table 1 below and a corresponding wiring condition. Also, the value may be transmitted by the communication device 132, as described below.

TABLE 1

| Light Emitting Device | | | | |
|---|---|---|---|---|
| 102 | 104 | 106 | Wiring Condition | Value |
| OFF | ON | ON | Correct wiring | 011 |
| OFF | ON | OFF | Open Ground | 010 |
| OFF | OFF | ON | Open Neutral | 001 |
| OFF | OFF | OFF | Open Hot | 000 |
| ON | ON | OFF | Hot and Neutral are reversed | 110 |
| ON | OFF | ON | Hot and Ground are reversed | 101 |

The wiring condition of the electrical socket (e.g., electrical socket 200) into which the electrical plug 114 is inserted includes a first wiring condition in which the electrical socket is correctly wired. More particularly, the first wiring condition is a condition in which the terminal 116 is electrically coupled to the hot voltage potential via the receptacle 204, the terminal 118 is electrically coupled to the neutral voltage potential, and the terminal 120 is electrically coupled to the ground voltage potential. While the outlet tester circuit 124 detects the first wiring condition, the outlet tester circuit 124 outputs the first control signal having a relatively low voltage level, the second control signal having the relatively low voltage level, and the third control signal having a relatively high voltage level. Accordingly, the light emitting device 102 is OFF, the light emitting device 104 is ON, and the light emitting device 106 is ON.

The wiring condition of the electrical socket (e.g., electrical socket 200) into which the electrical plug 114 is inserted includes a second wiring condition in which the electrical socket is not correctly wired because the ground voltage potential is not provided to the receptacle 206 of the electrical socket 200. More particularly, the second wiring condition is a condition in which the terminal 116 is electrically coupled to the hot voltage potential via the receptacle 204, the terminal 118 is electrically coupled to the neutral voltage potential, and the terminal 120 is not electrically coupled to the ground voltage potential. While the outlet tester circuit 124 detects the second wiring condition, the outlet tester circuit 124 outputs the first control signal having the relatively low voltage level, the second control signal having the relatively high voltage level, and the third control signal having the relatively low voltage level. Accordingly, the light emitting device 102 is OFF, the light emitting device 104 is ON, and the light emitting device 106 is OFF.

The wiring condition of the electrical socket (e.g., electrical socket 200) into which the electrical plug 114 is inserted includes a third wiring condition in which the electrical socket is not correctly wired because the neutral voltage potential is not provided to the receptacle 202 of the electrical socket 200. More particularly, the third wiring condition is a condition in which the terminal 116 is electrically coupled to the hot voltage potential via the receptacle 204, the terminal 118 is not electrically coupled to the neutral voltage potential, and the terminal 120 is electrically coupled to the ground voltage potential. While the outlet tester circuit 124 detects the third wiring condition, the outlet tester circuit 124 outputs the first control signal having the relatively low voltage level, the second control signal having the relatively low voltage level, and the third control signal having the relatively high voltage level. Accordingly, the light emitting device 102 is OFF, the light emitting device 104 is OFF, and the light emitting device 106 is ON.

The wiring condition of the electrical socket (e.g., electrical socket 200) into which the electrical plug 114 is inserted includes a fourth wiring condition in which the electrical socket is not correctly wired because the hot voltage potential is not provided to the receptacle 204 of the electrical socket 200. More particularly, the fourth wiring condition is a condition in which the terminal 116 is not electrically coupled to the hot voltage potential via the receptacle 204, the terminal 118 is electrically coupled to the neutral voltage potential, and the terminal 120 is electrically coupled to the ground voltage potential. While the outlet tester circuit 124 detects the fourth wiring condition, the outlet tester circuit 124 outputs the first control signal having the relatively low voltage level, the second control signal having the relatively low voltage level, and the third control signal having the relatively low voltage level. Accordingly, the light emitting device 102 is OFF, the light emitting device 104 is OFF, and the light emitting device 106 is OFF.

The wiring condition of the electrical socket (e.g., electrical socket 200) into which the electrical plug 114 is inserted includes a fifth wiring condition in which the electrical socket is not correctly wired because the hot voltage potential and the neutral voltage potential are reversed. More particularly, the fifth wiring condition is a condition in which the terminal 116 is electrically coupled to the neutral voltage potential via the receptacle 204, the terminal 118 is electrically coupled to the hot voltage potential via the receptacle 202, and the terminal 120 is electrically coupled to the ground voltage potential via the receptacle 206. While the outlet tester circuit 124 detects the fifth wiring condition, the outlet tester circuit 124 outputs the first control signal having the relatively high voltage level, the second control signal having the relatively high voltage level, and the third control signal having the relatively low voltage level. Accordingly, the light emitting device 102 is ON, the light emitting device 104 is ON, and the light emitting device 106 is OFF.

The wiring condition of the electrical socket (e.g., electrical socket 200) into which the electrical plug 114 is inserted includes a sixth wiring condition in which the electrical socket is not correctly wired because the hot voltage potential and the ground voltage potential are reversed. More particularly, the sixth wiring condition is a condition in which the terminal 116 is electrically coupled to the ground voltage potential via the receptacle 204, the terminal 118 is electrically coupled to the neutral voltage potential via the receptacle 202, and the terminal 120 is electrically coupled to the hot voltage potential via the receptacle 206. While the outlet tester circuit 124 detects the sixth wiring condition, the outlet tester circuit 124 outputs the first control signal having the relatively high voltage level, the second control signal having the relatively low voltage level, and the third control signal having the relatively high voltage level. Accordingly, the light emitting device 102 is ON, the light emitting device 104 is OFF, and the light emitting device 106 is ON.

The button 110 in FIG. 1A is mechanically coupled to the GFI tester circuit 126, which can be used to test a ground fault circuit interrupter in a socket. In one or more embodiments, when the button 110 is depressed, the GFI tester circuit 126 causes a ground fault in the socket. If the ground fault circuit interrupter in the socket is activated when the button is depressed, the ground fault circuit interrupter is working properly. If the ground fault circuit interrupter in the socket is not activated when the button is depressed, the ground fault circuit interrupter is not working properly. In one or more alternative embodiments, the processor 130 is coupled to the GFI tester circuit 126, and the processor 130 outputs a control signal to the GFI tester circuit 126 that causes the GFI tester circuit 126 to cause a ground fault in the socket, in response to receiving a message via the communication device 132.

The communication device 132 includes a transmitter, a receiver, and an antenna that wirelessly transmit and receive signals according to a communication protocol. In one or more embodiments, the communication device 132 and receive signals according to one or more Bluetooth communication protocols. In one or more alternative embodiments, the communication device 132 and receive signals according to one or more of the IEEE 802.11 local area network (LAN) protocols. In one or more embodiments, the processor 130, communication device 132, and memory 138 are provided together in an integrated circuit.

The memory 138 is electrically coupled to the processor 130 and stores computer-readable instructions that, when executed by the processor 130, causes the processor 130 to perform the various operations of the processor 130 described herein. For example, the memory 138 stores computer-readable instructions that, when executed by the processor 130, causes the processor 130 to receive the first, second, and third control signals that are output from the outlet tester circuit 124 to the receptive input terminals of the processor 130. In addition, the instructions cause the processor 130 to control the communication device 132 to transmit a first message that includes data indicating the wiring condition of the electrical socket into which the electrical plug is inserted, based on the first, second, and third control signals received from the outlet tester circuit 124. For example, the first message includes a value shown in Table 1 that corresponds to the wiring condition indicated by the outlet tester circuit 124 via the first, second, and third control signals. In addition, the instructions cause the processor 130 to control the whether the sound emitting device emits one or more sounds. For example, the instructions cause the processor 130 transmit a control signal to the switch circuit 134, which controls whether power is supplied from the DC voltage regulator 128 to the buzzer circuit 136, as described above. The processor 130 controls the switch circuit 134 such that the one or more sounds emitted by the buzzer circuit 136 have different acoustic characteristics (e.g., pitch, volume, duration, etc.) depending on the first, second, and third control signals output by the outlet tester circuit 124.

In addition, the instructions may cause the processor 130 to output a first control signal that causes the sound emitting device of the buzzer circuit 136 to emit the one or more sounds with a first acoustic characteristic, and output a second control signal that causes the sound emitting device of the buzzer circuit 136 to emit the one or more sounds with a second acoustic characteristic that is different from the first acoustic characteristic.

For example, the first control signal may cause the switch circuit 134 to be in the conductive state for a first period of time and then be in the non-conductive state for a second period of time, and the second control signal causes the switch circuit 134 to be in the conductive state for a third period of time and then be in the non-conductive state for a fourth period of time, wherein the first period of time is greater than the third period of time, and the second period of time is less than the fourth period of time. Thus, the processor 130 can cause the sound emitting device of the buzzer circuit 136 to produce sounds with different durations, in order to acoustically indicate different types of test results to a user. The first through fourth wiring conditions shown in Table 1 include a correct wiring condition and several wiring conditions related to relatively minor problems (e.g., a particular voltage potential is not electrically coupled to the socket). The fifth and sixth wiring conditions shown in Table 1 represent wiring conditions related to more serious problems (e.g., the hot voltage potential is electrically coupled to a wrong receptacle of the socket) which could damage an electrical device if the electrical device is plugged into the socket. The processor 130 may cause the sound emitting device of the buzzer circuit 136 to produce a sound with a relatively long duration when the first, second, and third control signals received from the outlet tester circuit 124 indicate the first, second, third, or fourth wiring conditions shown in Table 1, and may cause the buzzer circuit 136 to produce a sound with a relatively short duration that repeats frequently when the first, second, and third control signals received from the outlet tester circuit 124 indicate the fifth or sixth wiring conditions shown in Table 1.

In one or more embodiments, the buzzer circuit 136 is connected to the processor 130, and the processor 130 provides control signals directly to the buzzer circuit 136. The processor 130 can provide a first control signal to the buzzer circuit 136 that causes the buzzer circuit 136 produce a sound having a relatively long duration, and can provide a second control signal to the buzzer circuit 136 that causes the buzzer circuit 136 produce a sound having a relatively short duration. Additionally or alternatively, the first control signal may cause the buzzer circuit 136 to produce a sound having a relatively low volume level, and the second control signal may cause the buzzer circuit 136 to produce a sound having a relatively high volume level. In other words, the control signals may cause the buzzer circuit 136 to produce one or more sounds with a first acoustic characteristic and a second acoustic characteristic, wherein the one or more sounds with the first acoustic characteristic have a greater volume level than the one or more sounds with second acoustic characteristic. For example, the processor 130 outputs the first control signal to the buzzer circuit 136 when the first, second, and third control signals received from the outlet tester circuit 124 indicate the first, second, third, or fourth wiring conditions shown in Table 1, and outputs the second control signal to the buzzer circuit 136 when the first, second, and third control signals received from the outlet tester circuit 124 indicate the fifth or sixth wiring conditions shown in Table 1.

In one or more embodiments, the socket tester 100 may include a battery that provides power to the processor 130, communication device 132, and buzzer circuit 136, so that they can operate even if the electrical plug 114 is not plugged into a properly wired socket that is receiving power. The memory 138 stores instructions that cause the processor 130 to determine whether the electrical plug 114 was previously receiving power from the electrical socket, but is no longer receiving power from the electrical socket, based on the first, second, and third control signals output from the outlet tester circuit 124. For example, if the first, second, and third control signals output from the outlet tester circuit 124 indicate a wiring condition in which the hot voltage potential is supplied to the electrical plug 114, and subsequently the first, second, and third control signals output from the outlet tester circuit 124 indicate a wiring condition in which the hot voltage potential is not supplied to the electrical plug 114, the processor 130 (as now powered by the battery) determines that the electrical plug 114 is no longer receiving power from the electrical socket. In response, the processor 130 may cause the sound emitting device of the buzzer circuit 136 to emit sound and/or cause a message to be transmitted by the communication device 132.

In one or more embodiments, the memory 138 stores instructions that cause the processor 130 to determine whether the electrical plug 114 was previously not receiving power from the electrical socket, but has started receiving power from the electrical socket, based on the first, second, and third control signals output from the outlet tester circuit 124. For example, if the first, second, and third control signals output from the outlet tester circuit 124 indicate a wiring condition in which the hot voltage potential is not supplied to the electrical plug 114, and subsequently the first, second, and third control signals output from the outlet tester circuit 124 indicate a wiring condition in which the hot voltage potential is supplied to the electrical plug 114, the processor 130 determines that the electrical plug 114 has started receiving power from the electrical socket. In response, the processor 130 may cause the sound emitting device of the buzzer circuit 136 to emit sound and/or cause a message to be transmitted by the communication device 132.

Figure 4:
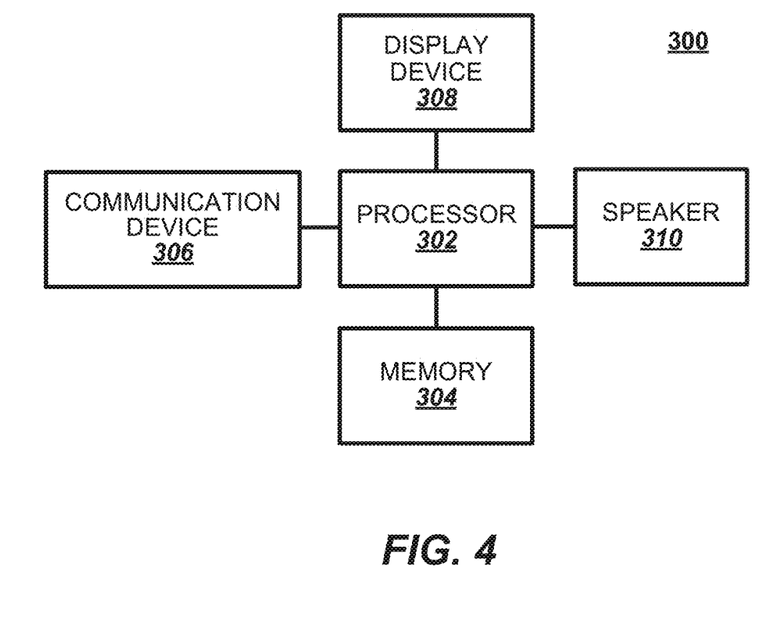
FIG. 4 is a block diagram of processing device that can wirelessly communicate with the socket tester device shown in FIG. 1A, according to one or more embodiments of the present disclosure.

FIG. 4 is a block diagram of processing device 300 that can wirelessly communicate with the socket tester device 100, according to one or more embodiments of the present disclosure. As will be appreciated from the disclosure herein, the processing device 300 may be carried by a user to a location that is remote from the socket tester device 100. The block diagram shown in FIG. 4 is a simplified block diagram that omits details not relevant to the present disclosure. The processing device 300 includes a processor 302, a memory 304, a communication device 306, a user interface (which, for example, may include a display device 308 and/or a speaker 310). In one or more embodiments, the processing device 300 is a cellular telephone, for example, a smartphone.

The processor 302 is electrically coupled to the memory 308, which stores computer-readable instructions that, when executed by the processor 302, cause the processing device 300 to perform the various operations of the processor 302 described herein.

The communication device 306 is electrically coupled to the processor 302 and includes a transmitter, a receiver, and an antenna that wirelessly transmit and receive signals according to a communication protocol. In one or more embodiments, the communication device 306 can transmit and receive signals according to a Bluetooth communication protocol. In one or more alternative embodiments, the communication device 306 can transmit and receive signals according to one or more of the IEEE 802.11 local area network protocols. The communication device 306 wirelessly communicates with the communication device 132 of the socket tester device 100 and data is exchanged between the processing device 300 and the socket tester device 100 using a known data communication protocol, for example, Internet Protocol (IP) or User Datagram Protocol (UDP).

The display device 308 is electrically coupled to the processor 302 and displays information based on instructions from the processor 302. For example, the display device 308 is a liquid crystal display (LCD) device. The display device 308 may include a touchscreen sensor that enables a user to input data and instructions.

The speaker 310 is electrically coupled to the processor 302 and emits sounds based on instructions from the processor 302. For example, the processor 302 may cause the speaker 310 to emit a sound that is similar to the sound emitted by the buzzer circuit 136 of the socket tester device 100.

In one or more embodiments, the memory 308 stores instructions that, when executed by the processor 302, cause the processing device 300 to display a display screen for remotely controlling whether the sound emitting device of the buzzer circuit 136 emits sound. For example, the display screen may include two icons that can be selected to remotely control whether the sound emitting device of the buzzer circuit 136 emits sound. In this example, the display screen includes an icon labeled "Buzzer On" and an icon labeled "Buzzer Off". If a user selects one of those icons (e.g., by placing a finger on a portion of the display device 308), the processor 302 causes the communication device 306 to transmit a message to the socket tester device 100, which the processor 130 of the socket tester device 100 uses to control whether the sound emitting device of the buzzer circuit 136 emits sound, in response to the message received by the communication device 132 of the socket tester device 100.

In one or more implementations, a message that is transmitted by the communication device 306 of the processing device 300 and received by the communication device 132 of the socket tester device 100 includes a plurality of fields, including a first field having a value of an address of the processing device 300 (e.g., IP address or media access control (MAC) address), a second field having a value indicating that the message is a first type of buzzer control command (e.g., "01"), and a third field having a value indicating whether the sound emitting device of the buzzer circuit 136 is to be configured to emit sound (e.g., "0" or "1").

In one or more embodiments, the memory 138 of the socket tester device 100 stores instructions that cause the processor 130 to control whether the sound emitting device of the buzzer circuit 136 is configured to emit sound in response to the message being received by the communication device 132. For example, when the third field of the message received by the communication device 132 has a value of "0", the processor 130 outputs a first control signal that causes the switch circuit 134 to be in the non-conductive state, as described above. Thus, the first control signal prevents the sound emitting device of the buzzer circuit 136 from emitting a sound. Additionally, when the third field of the message received by the communication device 132 has a value of "1", the processor 130 outputs a second control signal that causes the switch circuit 134 to be in the conductive state, as described above. Thus, the second control signal causes the sound emitting device of the buzzer circuit 136 to emit a sound, for example, if the electrical plug 114 is inserted into a socket to which power is provided.

In one or more embodiments, the memory 138 of the socket tester device 100 stores a value (e.g., IP address or MAC address of the processing device 300) that uniquely identifies the processing device 300, and may be configured to act on a message received by the communication device 132 only if the first field of the message includes the value that is stored. This prevents the socket tester device 100 from acting on a message received from an unauthorized device. Accordingly, when the first field of a message received by the communication device 132 has the value that is stored and the third field of the message has a value of "0", the processor 130 outputs the first control signal that causes the switch circuit 134 to be in the non-conductive state, as described above. Additionally, when the first field of a message received by the communication device 132 has the value that is stored and the third field of the message has a value of "1", the processor 130 outputs the second control signal that causes the switch circuit 134 to be in the conductive state, as described above. In the examples above, if the first fields of those messages did not include the value that is stored, the processor 130 would not output the first and second control signals.

Use of the socket tester device 100 will now be described. Initially, a user of the socket tester device 100 may download an application (e.g., from a website) onto the processing device 300, for example, the user's cell phone. The application enables the user's cell phone to communicate with the socket tester device 100.

In one or more embodiments, the communication device 132 of the socket tester device 100 includes a Bluetooth transceiver that broadcasts identifying information, for example, including the text "Fluke Socket Tester". The user's cell phone displays a list of Bluetooth devices to which the cell phone can connect. When the user selects an area of the display device 308 on which the "Fluke Socket Tester" is displayed, a Bluetooth transceiver included in the communication device 306 of the processing device 300 wirelessly connects to the Bluetooth transceiver included in the communication device 132 of the socket tester device 100.

In one or more alternative embodiments, the communication device 132 of the socket tester device 100 includes a wireless local area network (WLAN) transceiver that functions as a wireless access point and broadcasts identifying information, for example, including the text "Fluke Socket Tester". The user's cell phone displays a list of WLAN devices to which the cell phone can connect. The user selects an area of the display device 308 on which the "Fluke Socket Tester" is displayed and enters a predetermined password, which causes a WLAN transceiver included in the communication device 306 of the processing device 300 to wirelessly connect to the WLAN transceiver included in the communication device 132 of the socket tester device 100.

After the user installs the application and wirelessly connects the communication device 306 of the processing device 300 to the communication device 132 of the socket tester device 100, the user causes the application to be executed, for example, by selecting an icon associated with the application that is displayed by the display device 308. The application causes the display device 308 to display a display screen that enables the user to set an operating mode of the socket tester device 100. In one or more implementations, the display screen includes a plurality of icons corresponding to a plurality of operating modes of the socket tester device 100. In response to the user selecting one of the icons, the processor 302 of the processing device 300 causes the communication device 306 to transmit to the socket tester device 100 a message with data indicating the operating mode corresponding to the selected icon. After the message is received by the communication device 132, the processor 130 causes the socket tester device 100 to operate in the operating mode indicated by the message.

In one example, the user inserts the electrical plug 114 into a socket and then selects an icon that causes the socket tester device 100 to operate in a mode for identifying a circuit breaker that is electrically connected to the socket into which the electrical plug 114 of the socket tester device 100 is inserted using a sound emitted by the sound emitting device of the buzzer circuit 136. While operating in this operating mode, the processor 130 of the socket tester device 100 determines whether the electrical plug is no longer receiving power from the electrical socket, as described above. The user then goes to the circuit breaker box and begins switching off and then on circuit breakers included in the circuit breaker box, one by one. When the user switches off the circuit breaker that is electrically connected to the socket into which the electrical plug 114 of the socket tester device 100 is inserted, the electrical plug 114 no longer receives power. Accordingly, the processor 130 of the socket tester device 100 causes the sound emitting device of the buzzer circuit 136 to emit a sound. When the user hears the sound, the user can deduce that the circuit breaker currently switched off is the circuit breaker that is electrically coupled to the socket into which the electrical plug 114 of the socket tester device 100 is inserted. The user may then switch that circuit breaker back on. In response, the processor 130 of the socket tester device 100 causes the sound emitting device of the buzzer circuit 136 to stop emitting the sound.

In another example, the user inserts the electrical plug 114 into a socket and then selects an icon that causes the socket tester device 100 to operate in a mode for identifying a circuit breaker that is electrically connected to the socket into which the electrical plug 114 of the socket tester device 100 is inserted using a message that is transmitted wirelessly from the communication device 132. While operating in this operating mode, the processor 130 of the socket tester device 100 determines whether the electrical plug is no longer receiving power from the electrical socket, as described above. The user then goes to the circuit breaker box and begins switching off and then on circuit breakers included in the circuit breaker box, one by one. When the user switches off the circuit breaker that is electrically connected to the socket into which the electrical plug 114 of the socket tester device 100 is inserted, the electrical plug 114 no longer receives power. Accordingly, the processor 130 of the socket tester device 100 causes the communication device 132 to wirelessly transmit a message including data indicating that the electrical plug 114 is no longer receiving power. When the communication device 306 of the processing device 300 receives the message, the processing device 300 causes the speaker 310 to emit a sound and/or causes the display device 308 to display a message indicating that the electrical plug 114 of the socket tester device 100 is no longer receiving power. When the user hears the sound emitted by the speaker 310 and/or sees the message displayed by the display device 308, the user can deduce that the circuit breaker currently switched off is the circuit breaker that is electrically coupled to the socket into which the electrical plug 114 of the socket tester device 100 is inserted.

In the above examples, the user is informed about the wiring condition of the socket into which the electrical plug 114 of the socket tester device 100 is inserted without disturbing others in the vicinity of the socket. For example, in contrast, if the user were to plug a radio into the socket in order to determine which circuit breaker is connected to that socket, the user would need to set the radio to a volume that enables the sound from the radio to be heard in a room in which a circuit breaker box is located, which may disturb others in the vicinity of the socket. After the circuit breaker is located and turned back on, the sound would continue until the user returns to the room in which the socket is located and turns off the radio. In the above examples, the user can determine which circuit breaker is connected to the socket into which the electrical plug 114 of the socket tester device 100 is inserted, using a sound that is emitted for a relatively short duration, or without any sound at all.

In yet another example, the user inserts the electrical plug 114 into a socket that has just been installed and is connected to a circuit breaker that is known to the user, which is currently switched off. Then the user selects an icon that causes the socket tester device 100 to operate in a mode for wirelessly identifying a wiring condition of the socket into which the electrical plug 114 is inserted. While operating in this operating mode, the processor 130 of the socket tester device 100 determines the wiring condition based on the first, second, and third control signals output by the outlet tester circuit 124, and causes the communication device 132 to transmit a message that includes data indicating the wiring condition. The user then goes to the circuit breaker box and switches on the circuit breaker that is electrically coupled to the socket into which the electrical plug 114 is inserted. In response to the outlet tester circuit 124 outputting the first, second, and third control signals to the processor 130, the processor 130 causes the communication device 132 to transmit the message that includes data indicating the wiring condition. When the communication device 306 of the processing device 300 receives the message, the processing device 300 causes the display device 308 to display a message indicating the wiring condition indicated by the data included in the message. For example, the memory 304 stores a look-up table (or other suitable data structure), wherein each entry of the look-up table includes one of the values shown in Table 1 below and a corresponding wiring condition. In this example, if the message includes the value "000", the processor 130 causes the display device 308 to display a message "Open Hot". Accordingly, the user is informed that the socket is not wired properly. Thus, the user may switch off the circuit breaker and return to the room in which the socket is installed to inspect the wiring connected to the socket.

In the above example, the user is informed about the wiring condition of the socket into which the electrical plug 114 of the socket tester device 100 is inserted while the user is located near a circuit breaker box, which is typically in a different room than the socket into which the electrical plug 114 of the socket tester device 100 is inserted. Thus, the socket tester device 100 can save the user time compared to conventional socket testing devices that require the user to return to the room in which the socket testing devices are located to be informed about the wiring condition detected by such conventional socket testing devices.

The various embodiments described above can be combined to provide further embodiments. In addition, the socket tester device 100 may include a second switch circuit electrically coupled between the switch circuit 134 and the buzzer circuit 136, wherein the second switch circuit is coupled to the switch 112, which is operable to change the state of the second switch circuit between a conductive state to a non-conductive state, to enable or prevent the buzzer circuit 136 from outputting sound, respectively. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A socket tester device, comprising:
an electrical plug configured to be inserted into an electrical socket;
a tester circuit electrically coupled to the electrical plug, wherein the tester circuit outputs one or more signals indicating a wiring condition of the electrical socket into which the electrical plug is inserted;
a sound emitting device;
a communication device;
a processor electrically coupled to the tester circuit, the sound emitting device, and the communication device; and
a memory storing instructions that, when executed by the processor, cause the processor to:
receive the one or more signals indicating the wiring condition of the electrical socket into which the electrical plug is inserted,
control the communication device to wirelessly transmit a first message that includes data indicating the wiring condition of the electrical socket into which the electrical plug is inserted, and
control whether the sound emitting device emits one or more sounds,
wherein the communication device, in operation, wirelessly receives a second message, and the instructions, when executed by the processor, cause the processor to control whether the sound emitting device emits the one or more sounds in response to data in the second message received by the communication device.

2. The socket tester device according to claim 1, wherein the instructions, when executed by the processor, cause the processor to control whether the sound emitting device emits one or more sounds based on a value included in a field of the second message.

3. The socket tester device according to claim 2, wherein the instructions, when executed by the processor, cause the processor to output a first control signal that causes the sound emitting device to emit the one or more sounds with a first acoustic characteristic in response to the field included in the second message having a first value, and to output a second control signal that causes the sound emitting device to emit the one or more sounds with a second acoustic characteristic that is different from the first acoustic characteristic in response to the field included in the second message having a second value.

4. The socket tester device according to claim 3, wherein the one or more sounds with the first acoustic characteristic has a greater volume level than the one or more sounds with second acoustic characteristic.

5. The socket tester device according to claim 4, wherein the one or more sounds with the first acoustic characteristic has a different duration than the one or more sounds with the second acoustic characteristic.

6. The socket tester device according to claim 1, wherein the instructions, when executed by the processor, cause the processor to output a control signal that causes the sound emitting device to emit the one or more sounds, in response to receiving the second message.

7. The socket tester device according to claim 1, wherein the instructions, when executed by the processor, cause the processor to transmit the first message in response to determining that the electrical plug is no longer receiving power from the electrical socket.

8. The socket tester device according to claim 1, wherein the instructions, when executed by the processor, cause the processor to cause the sound emitting device to emit the one or more sounds in response to determining that the electrical plug is no longer receiving power from the electrical socket.

9. The socket tester device according to claim 1, wherein the instructions, when executed by the processor, cause the processor to transmit the first message or cause the sound emitting device to emit the one or more sounds in response to determining that the electrical plug has started receiving power from the electrical socket.

10. The socket tester device according to claim 1, further comprising:
a switch circuit electrically coupled to the processor and the sound emitting device,
wherein the instructions, when executed by the processor, cause the processor to control whether the switch circuit is in an electrically conductive state or an electrically non-conductive state, to control whether sound emitting device emits the one or more sounds.

11. The socket tester device according to claim 10, wherein the switch circuit is electrically coupled between the electrical plug and the sound emitting device.

12. The socket tester device according to claim 1, further comprising:
a plurality of light emitting devices, wherein one or more of the light emitting devices are illuminated based on the wiring condition of the electrical socket into which the electrical plug is inserted.

13. A socket tester device, comprising:
an electrical plug configured to be inserted into an electrical socket;
a tester circuit electrically coupled to the electrical plug, wherein the tester circuit outputs one or more signals indicating a wiring condition of the electrical socket into which the electrical plug is inserted;
a sound emitting device;
a communication device;
a processor electrically coupled to the tester circuit, the sound emitting device, and the communication device; and
a memory storing instructions that, when executed by the processor, cause the processor to:
    receive the one or more signals indicating the wiring condition of the electrical socket into which the electrical plug is inserted,
    control the communication device to wirelessly transmit a first message that includes data indicating the wiring condition of the electrical socket into which the electrical plug is inserted, and
    control whether the sound emitting device emits one or more sounds,
wherein the electrical socket includes a first receptacle configured to be electrically coupled to a neutral voltage potential, a second receptacle configured to be electrically coupled to a hot voltage potential, and a third receptacle configured to be electrically coupled to a ground voltage potential, and
wherein the wiring condition of the electrical socket is selected from a group consisting of:
    a first wiring condition in which the first receptacle is electrically coupled to the neutral voltage potential, the second receptacle is electrically coupled to the hot voltage potential, and the third receptacle is electrically coupled to the ground voltage potential;
    a second wiring condition in which the third receptacle is not electrically coupled to the ground voltage potential;
    a third wiring condition in which the first receptacle is not electrically coupled to the neutral voltage potential;
    a fourth wiring condition in which the second receptacle is not electrically coupled to the hot voltage potential;
    a fifth wiring condition in which the first receptacle is electrically coupled to the hot voltage potential and the second receptacle is electrically coupled to the neutral voltage potential; and
    a sixth wiring condition in which the second receptacle is electrically coupled to the ground voltage potential, and the third receptacle is electrically coupled to the hot voltage potential,
wherein the instructions, when executed by the processor, cause the processor to output a first control signal that causes the sound emitting device to emit the one or more sounds with a first acoustic characteristic in response to the wiring condition of the electrical socket being the first wiring condition, the second wiring condition, the third wiring condition, or the fourth wiring condition, and
wherein the instructions, when executed by the processor, cause the processor to output a second control signal that causes the sound emitting device to emit the one or more sounds with a second acoustic characteristic that is different from the first acoustic characteristic in response to the wiring condition of the electrical socket being the fifth wiring condition or the sixth wiring condition.

14. A method of operating a socket tester device that includes an electrical plug configured to be inserted into an electrical socket, a communication device, a processor, and a sound emitting device, the method comprising:
    receiving, by the processor, one or more signals indicating a wiring condition of the electrical socket into which the electrical plug is inserted;
    wirelessly transmitting, by the communication device, a first message that includes data indicating the wiring condition of the electrical socket into which the electrical plug is inserted;
    outputting, by the processor, a control signal that controls whether the sound emitting device emits one or more sounds; and
    wirelessly receiving, by the communication device, a second message,
    wherein the outputting the control signal that controls whether the sound emitting device emits the one or more sounds is performed in response to a value in the received second message.

15. The method according to claim 14, wherein the outputting the control signal that controls whether the sound emitting device emits the one or more sounds is performed in response to the one or more signals indicating the wiring condition of the electrical socket into which the electrical plug is inserted.

16. The method according to claim 14, wherein the socket tester device includes a switch circuit electrically coupled to the processor and the sound emitting device, and
    wherein the control signal that controls whether the sound emitting device emits the one or more sounds controls whether the switch circuit is in an electrically conductive state or an electrically non-conductive state.

17. The method according to claim 14, further comprising:
    determining that the electrical plug is no longer receiving power from the electrical socket,
    wherein the outputting the control signal that controls whether the sound emitting device emits the one or more sounds includes outputting a control signal causes the sound emitting device to emit the one or more sounds in response to the determining that the electrical plug is no longer receiving power from the electrical socket.

18. The method according to claim 14, further comprising:
    determining that the electrical plug is no longer receiving power from the electrical socket,
    wherein the transmitting the first message that includes data indicating the wiring condition of the electrical socket into which the electrical plug is inserted is performed in response to the determining that the electrical plug is no longer receiving power from the electrical socket.

* * * * *